(12) United States Patent
Matsuo

(10) Patent No.: US 9,881,019 B2
(45) Date of Patent: Jan. 30, 2018

(54) ROTATING ELECTRIC MACHINE SYSTEM

(71) Applicant: Hitachi Automotive Systems, Ltd., Hitachinaka-shi, Ibaraki (JP)

(72) Inventor: Takeshi Matsuo, Hitachinaka (JP)

(73) Assignee: HITACHI AUTOMOTIVE SYSTEMS, LTD., Hitachinaka-Shi, Ibaraki (JP)

( * ) Notice: Subject to any disclaimer, the term of this patent is extended or adjusted under 35 U.S.C. 154(b) by 405 days.

(21) Appl. No.: 14/670,957

(22) Filed: Mar. 27, 2015

(65) Prior Publication Data
US 2015/0199376 A1    Jul. 16, 2015

Related U.S. Application Data

(63) Continuation of application No. 13/580,263, filed as application No. PCT/JP2010/064279 on Aug. 24, 2010.

(30) Foreign Application Priority Data

Feb. 26, 2010    (JP) ................. 2010-041233

(51) Int. Cl.
*H02K 5/20*    (2006.01)
*H02K 5/22*    (2006.01)
(Continued)

(52) U.S. Cl.
CPC .. *G06F 17/30174* (2013.01); *G06F 17/30091* (2013.01); *G06F 17/30156* (2013.01);
(Continued)

(58) Field of Classification Search
CPC ........ H02K 11/04; H02K 11/046; H02K 9/19; H02K 9/197; H02K 9/36; H02K 9/365
(Continued)

(56) References Cited

U.S. PATENT DOCUMENTS 4,739,204 A * 4/1988 Kitamura ............. H02K 11/046
123/41.31
4,818,906 A * 4/1989 Kitamura ................. H02K 9/19
310/54
(Continued)

FOREIGN PATENT DOCUMENTS

JP    2002-314281 A    10/2002
JP    2003-101277 A    4/2003
(Continued)

*Primary Examiner* — Tran Nguyen
(74) *Attorney, Agent, or Firm* — Volpe and Koenig, P.C.

(57) ABSTRACT

A rotating electric machine system includes: a rotating electric machine including a stator and a rotor arranged with a gap to the stator; a casing configured to hold the stator; an electric power conversion apparatus held by the casing, and configured to drive the rotating electric machine; and a first cooling flow path arranged in a portion of the casing between the stator and the electric power conversion apparatus, via which cooling medium is caused to flow so as to cool the stator and the electric power conversion apparatus. And; the electric power conversion apparatus comprises a power module configured to include a power semiconductor element therein; the power module comprises a heat radiation fin; and the heat radiation fin is arranged to protrude toward a cooling medium side via an opening formed between the power module and the first cooling flow path.

6 Claims, 10 Drawing Sheets

(51) Int. Cl.
  *G06F 17/30* (2006.01)
  *H02K 9/19* (2006.01)
  *H02K 9/22* (2006.01)
  *H02K 11/33* (2016.01)
  *H05K 7/20* (2006.01)

(52) U.S. Cl.
  CPC ......... *G06F 17/30215* (2013.01); *H02K 5/20* (2013.01); *H02K 5/225* (2013.01); *H02K 9/19* (2013.01); *H02K 9/22* (2013.01); *H02K 11/33* (2016.01); *H05K 7/20927* (2013.01)

(58) Field of Classification Search
  USPC ............... 310/52, 54, 58, 59, 60 R, 60 A, 64
  See application file for complete search history.

(56) References Cited

U.S. PATENT DOCUMENTS

| | | | | |
|---|---|---|---|---|
| 4,980,588 A | * | 12/1990 | Ogawa | H02K 11/046 123/41.31 |
| 5,836,270 A | * | 11/1998 | Aoki | B60H 1/03 123/142.5 R |
| 6,160,332 A | * | 12/2000 | Tsuruhara | H02K 5/20 310/54 |
| 2001/0014029 A1 | * | 8/2001 | Suzuki | H02M 7/003 363/141 |
| 2004/0028539 A1 | * | 2/2004 | Williams | F04D 13/064 417/366 |
| 2009/0267432 A1 | * | 10/2009 | Henry | H02K 5/225 310/71 |
| 2010/0025126 A1 | * | 2/2010 | Nakatsu | B60L 11/00 180/65.1 |

FOREIGN PATENT DOCUMENTS

| | | |
|---|---|---|
| JP | 2005-224008 A | 8/2005 |
| JP | 2008-253041 A | 10/2008 |
| JP | 2009-295632 A | 12/2009 |

* cited by examiner

ROTATING ELECTRIC MACHINE SYSTEM

TECHNICAL FIELD

The present invention relates to a rotating electric machine (rotating electric machine system) having a structure monolithically integrated with an electric power conversion apparatus.

BACKGROUND ART

With conventional techniques, electric vehicles and hybrid vehicles have a typical configuration in which a rotating electric machine and an electric power conversion apparatus are mounted on the vehicle as separate respective components. From the perspective of the mounting space for mounting such components in the vehicle, and from the perspective of the optimum cooling method for cooling such components, in many cases, such components are preferably mounted as separate respective components. However, from the perspective of the demand to reduce the number of components, and from the perspective of a requirement to prevent surge from occurring between the rotating electric machine and the electric power conversion apparatus, such components are preferably configured as a single unit.

CITATION LIST

Patent Literature

PATENT DOCUMENT 1: Japanese Laid Open Patent Publication No. 2005-224008

SUMMARY OF INVENTION

Technical Problem

Patent document 1 discloses an inverter-integrated rotating electric machine. Such an inverter-integrated rotating electric machine employs a configuration including a cooling tank or the like, leading to a problem in that such an apparatus is required to have a large overall size.

The present invention provides a technique for allowing a rotating electric machine (rotating electric machine system) monolithically integrated with an electric power conversion apparatus to have a reduced size without a worsening of its performance.

Solution to Problem

According to the 1st aspect of the present invention, a rotating electric machine system comprises: a rotating electric machine including a stator and a rotor arranged with a gap to the stator; a casing configured to hold the stator; an electric power conversion apparatus held by the casing, and configured to drive the rotating electric machine; and a first cooling flow path arranged in a portion of the casing between the stator and the electric power conversion apparatus, via which cooling medium is caused to flow so as to cool the stator and the electric power conversion apparatus, wherein: the electric power conversion apparatus comprises a power module configured to include a power semiconductor element therein; the power module comprises a heat radiation fin; and the heat radiation fin is arranged to protrude toward a cooling medium side via an opening formed between the power module and the first cooling flow path.

According to the 2nd aspect of the present invention, in the rotating electric machine system according to the 1st aspect, it is preferred that the rotating electric machine system further comprises a second cooling flow path arranged in a portion of the casing outside of the stator to extend along a direction of rotation of the rotating electric machine, via which the cooling medium flows; and the second cooling flow path communicates with the first cooling flow path such that the cooling medium cools the stator after cooling the electric power conversion apparatus.

According to the 3rd aspect of the present invention, in the rotating electric machine system according to the 2nd aspect, it is preferred that: the first cooling flow path has a structure configured to change a direction in which the cooling medium flows; and the second cooling flow path communicates with the first cooling flow path such that the cooling medium cools the stator after cooling the electric power conversion apparatus and the second cooling flow path has a greater cross-sectional area than a cross-sectional area of the first cooling flow path at a communicating portion.

According to the 4th aspect of the present invention, in the rotating electric machine system according to the 1st aspect, it is preferred that: the power module is configured to include power semiconductor elements in two rows; and the first cooling flow path is configured such that the cooling medium cools the power semiconductor elements arranged in a first row, following which a direction in which the cooling medium flows is changed, and the cooling medium cools the other power semiconductor elements arranged in a second row.

According to the 5th aspect of the present invention, in the rotating electric machine system according to the 1st aspect, it is preferred that: the rotating electric machine system further comprises a temperature sensor arranged in a vicinity of the heat radiation fin; and cooling is controlled based upon temperature data acquired by the temperature sensor.

According to the 6th aspect of the present invention, a rotating electric machine system comprises: a rotating electric machine including a stator and a rotor configured to rotate with a gap to the stator; an electric power conversion apparatus held by a casing configured to hold the stator, and configured to drive the rotating electric machine; a first cooling flow path arranged at a portion of the casing between the stator and the electric power conversion apparatus, via which cooling medium is caused to flow so as to cool the electric power conversion apparatus; and a second cooling flow path arranged in a portion of the casing outside of the stator, and configured such that the stator is cooled by the cooling medium that flows via the second cooling flow path along a direction of rotation of the rotating electric machine, wherein: the first cooling flow path has a structure configured to change a direction in which the cooling medium flows; and the second cooling flow path communicates with the first cooling flow path such that the cooling medium cools the stator after cooling the electric power conversion apparatus, and the second cooling flow path has a greater cross-sectional area than a cross-sectional area of the first cooling flow path at a communicating portion.

According to the 7th aspect of the present invention, in the rotating electric machine system according to the 6th aspect, it is preferred that the electric power conversion apparatus comprises a power module configured to include power semiconductor elements in two rows; and the first cooling flow path is configured such that the cooling medium cools the power semiconductor elements arranged in a first row, following which a direction in which the cooling medium flows is changed, and the cooling medium cools the other power semiconductor elements arranged in a second row.

According to the 8th aspect of the present invention, in the rotating electric machine system according to the 7th aspect, it is preferred that: a heatsink plate of the power module includes a heat radiation fin; and the heat radiation fin is configured to protrude toward a cooling medium side via an opening formed between the power module and the first cooling path.

According to the 9th aspect of the present invention, in the rotating electric machine system according to the 8th aspect, it is preferred that: the rotating electric machine system further comprises a temperature sensor in a vicinity of the heat radiation fin; and cooling is controlled based upon temperature data acquired by the temperature sensor.

Advantageous Effect of the Invention

An electric power conversion apparatus employing a direct water cooling method provides low thermal resistance as compared with an electric power conversion apparatus employing a typical indirect water cooling method. Thus, such an arrangement requires only a small area to cool power semiconductor elements. That is to say, a water flow path is shared by the rotating electric machine and the electric power conversion apparatus, which are integrally configured as a single unit. Furthermore, the electric power conversion apparatus is cooled by means of a direct cooling method. Thus, such an arrangement provides a rotating electric machine system including a small-size electric power conversion apparatus.

DESCRIPTION OF EMBODIMENTS

Figure 5:
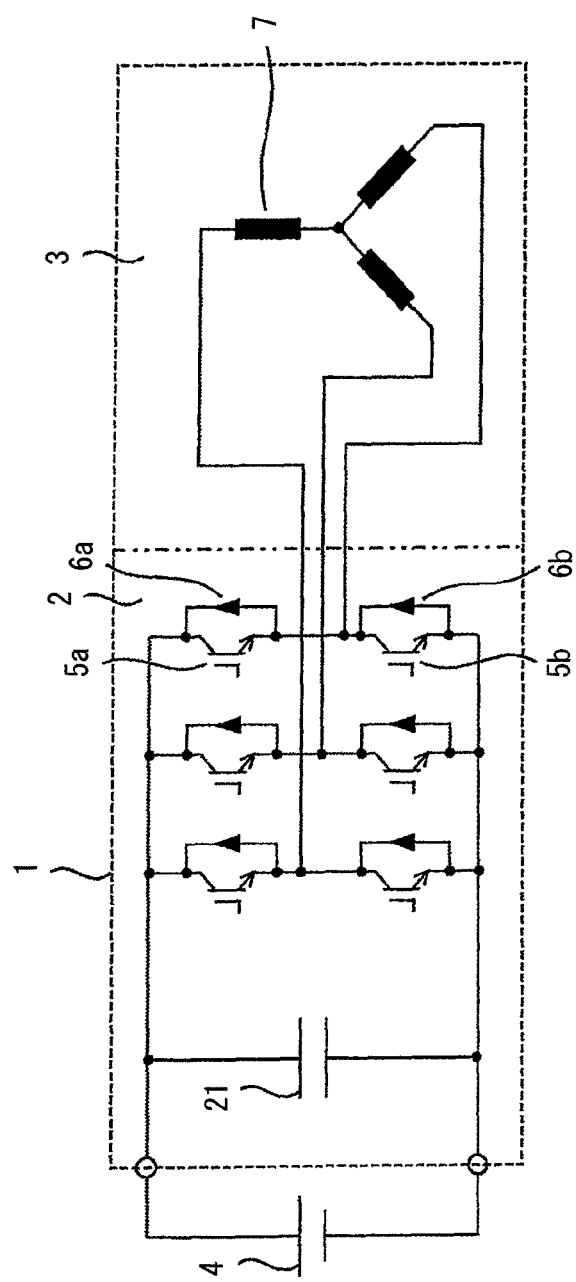
FIG. 5 is a main circuit diagram.

FIGS. 1 through 4 show an embodiment of the present invention. FIG. 5 shows a main circuit according to the present embodiment, and shows a configuration of how each principal component is electrically connected. For convenience, the electric power conversion apparatus will be referred to as the "inverter" and the rotating electric machine will be referred to as the "motor" hereafter. It should be noted that such a rotating electric machine functions not only as a motor but also functions as a generator. The motor includes a stator, and a rotor (not shown) arranged so as to rotate with a gap between it and the stator. Furthermore, the inverter is held by a housing configured to hold the stator, and is configured to drive the motor.

First, description will be made regarding an electrical function of the present embodiment. The portion surrounded by a broken line corresponds to an inverter-integrated motor 1 which will be described in the present embodiment. The inverter-integrated motor 1 can be roughly classified into two units, i.e., an inverter unit 2 and a motor unit 3. The inverter unit 2 is configured to perform switching of a power semiconductor element 5 in a regular manner so as to convert input (DC) electric power into AC electric power, and to transmit the AC electric power thus converted to the motor unit 3. Here, the motor is represented by the motor impedance 7 of the motor coil in the electric circuit diagram shown in FIG. 5. The AC electric power converted by the inverter passes through the motor impedance 7. Description will be made in the present embodiment assuming that the power semiconductor element 5 is configured as an IGBT (Insulated Gate Bipolar Transistor). Also, other kinds of power semiconductor elements (e.g., MOS-FET etc.) may be employed depending on the required frequency and voltage. Description will be made below regarding an arrangement including three IGBTs 5a and three flywheel (freewheel) diodes 6a on the positive electrode side (upper arm side) and the same number of IGBTs 5b and flywheel diodes 6b on the negative electrode side (lower arm side). With such an arrangement, each upper arm and lower arm pair corresponds to a single corresponding phase.

The pulsation (ripple) that occurs in the switching operation is smoothed by a smoothing capacitor 21 arranged between the battery 4 and a set of the power semiconductor elements 5.

Next, description will be made with reference to FIG. 1. The rectangular parallelepiped portion arranged in the upper portion in FIG. 1 corresponds to the inverter unit 2, and the cylindrical portion in the lower portion corresponds to the motor unit 3. Description will be made in the present embodiment regarding an arrangement in which a single metal housing (outer housing 10) is shared by the inverter unit 2 and the motor unit 3, thereby forming a monolithically integrated unit. That is to say, the upper section of the outer housing 10 corresponds to the inverter unit 2.

The interior space of the inverter unit 2 corresponds to an inverter chamber 13 mounting components configured to provide a function as an inverter. In practical use, a cover, which is not shown in the drawing in order to show the interior, is arranged at the top portion of the inverter unit in order to prevent foreign matter or fluid from contaminating the interior of the inverter chamber 13.

Figure 1:
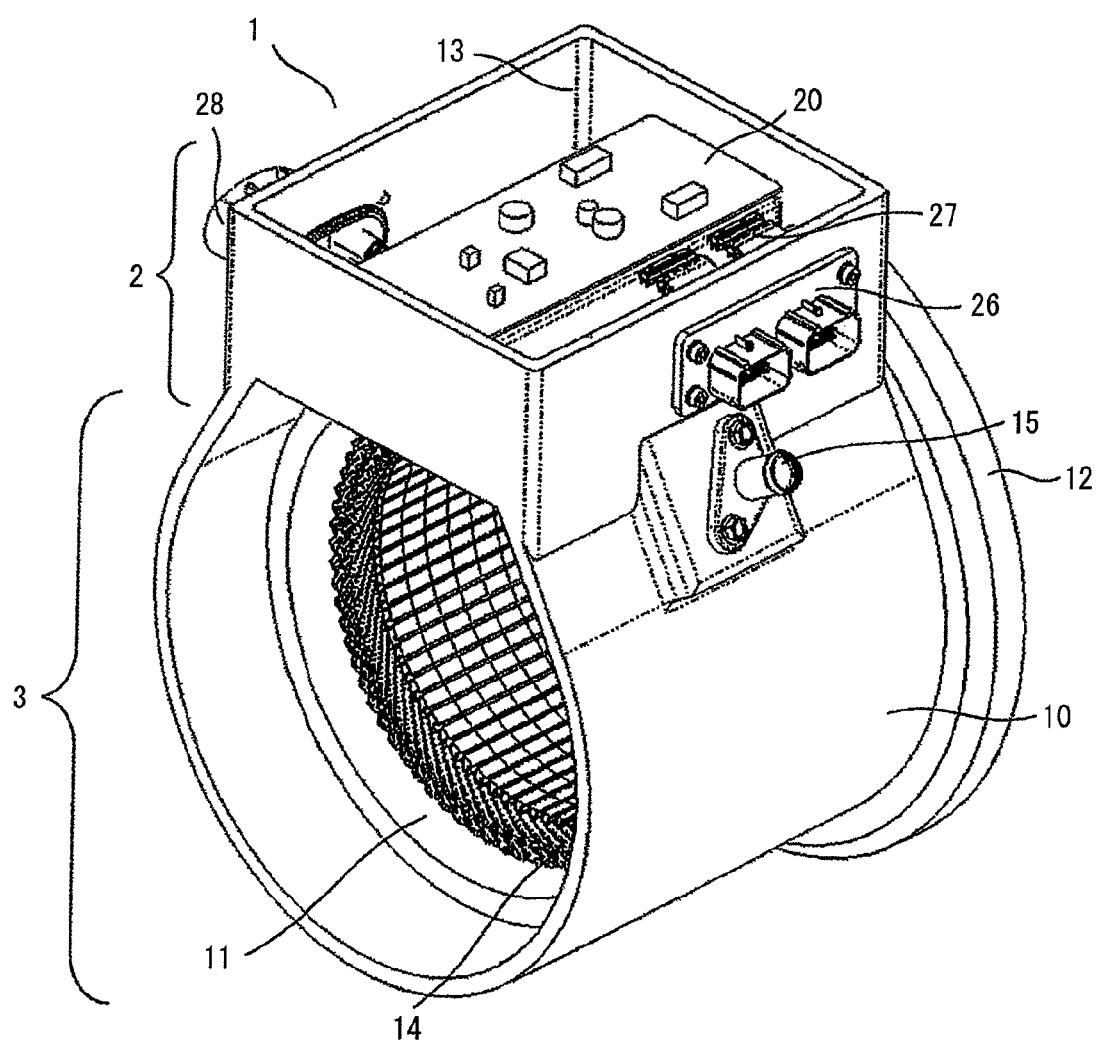
FIG. 1 is an external view (1) of a rotating machine system.
Figure 2:
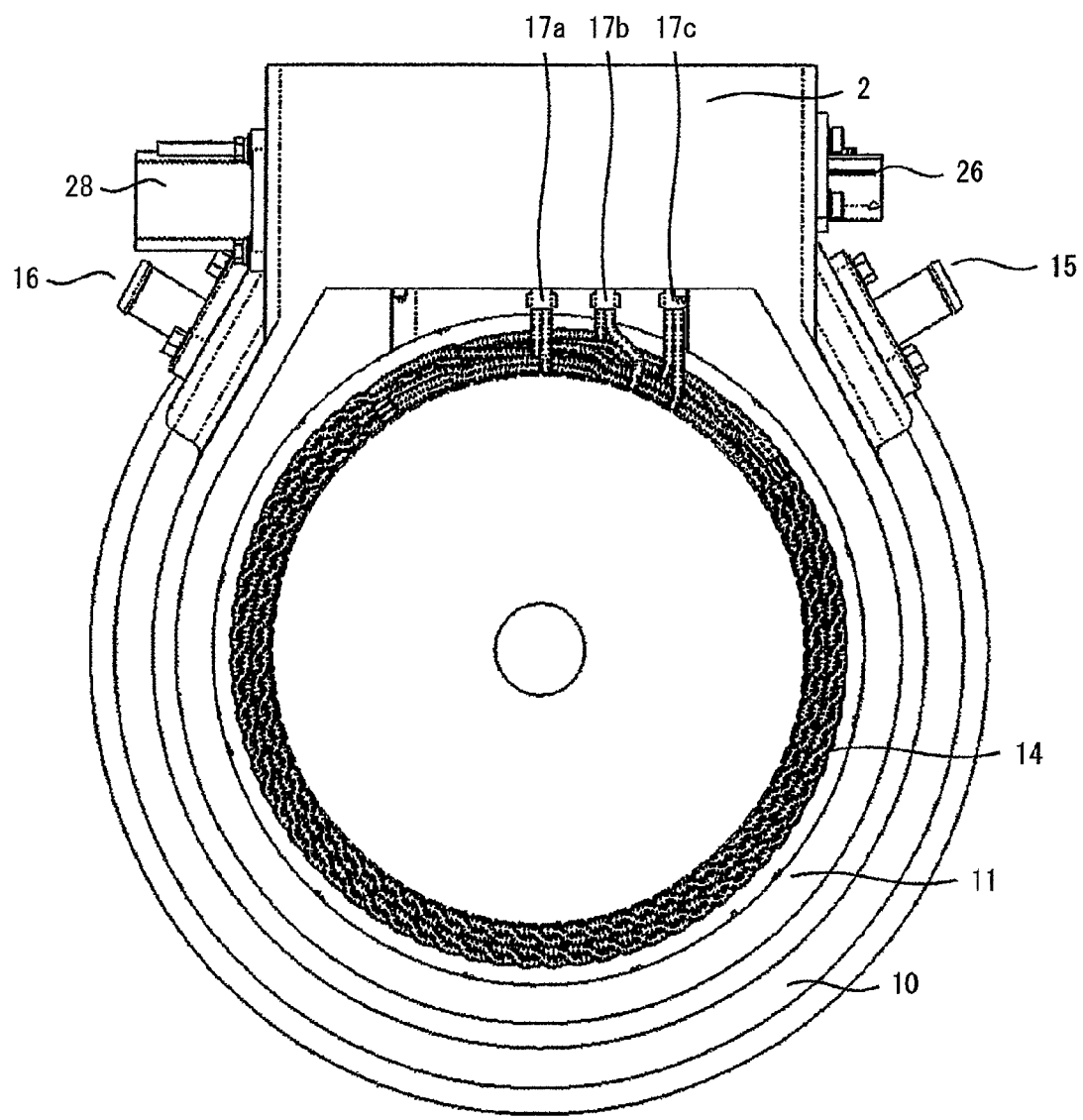
FIG. 2 is an external view (2) of the rotating machine system.

As can be clearly understood with reference to FIGS. 1 and 2, an inner housing 11 configured as a separate unit is arranged on the inner side of the outer housing 10 of the motor unit 3. Furthermore, a coil 14 of the motor is arranged on the inner side of the inner housing 11. The outer housing 10 includes a flange 12 which allows the inverter-integrated motor 1 to be mounted on an engine, transmission, gearbox, or the like, of a vehicle. Bolt holes are formed in the flange 12 in a desired manner, which are not shown in the drawing.

Figure 3:
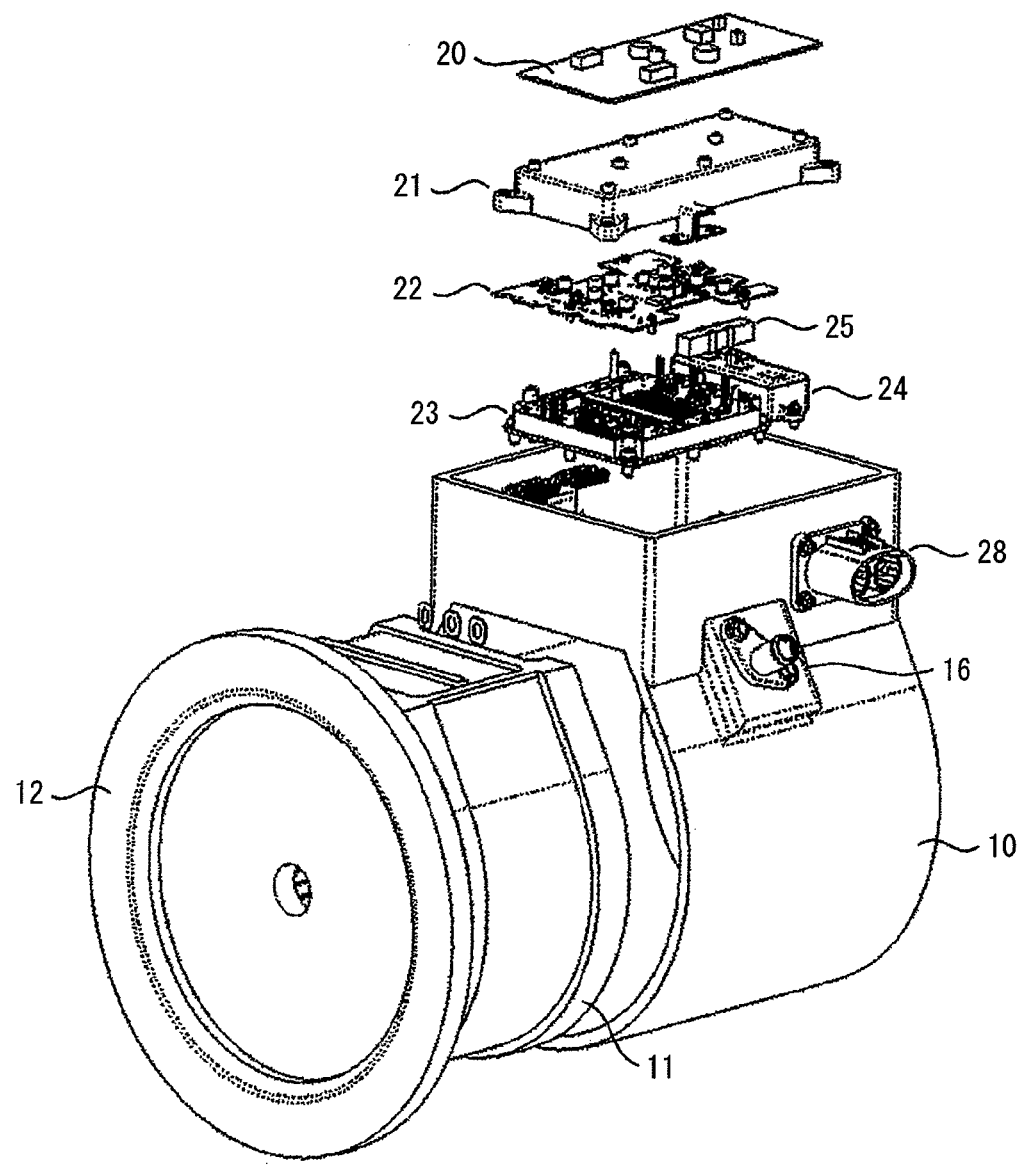
FIG. 3 is an external view (3) of the rotating machine system.
Figure 4:
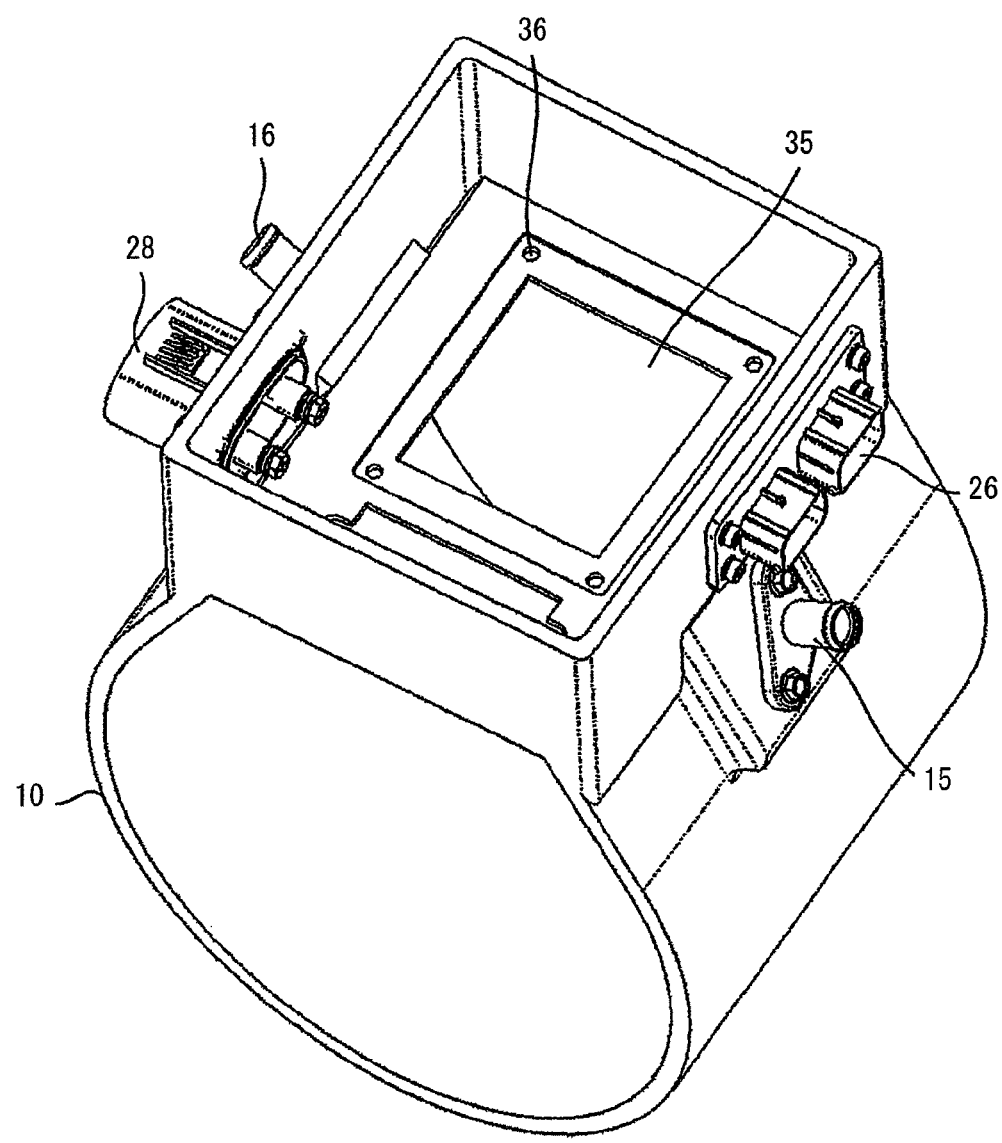
FIG. 4 is an external view (4) of the rotating machine system.

As shown in FIGS. 1 and 3, the inverter chamber 13 includes a motor control board 20 configured to control the motor, a smoothing capacitor 21 configured to smooth voltage ripples, a gate driving board 22 configured to control the on/off operation of the switching element according to an instruction received from the motor control board, and a power module 23 mounting the power semiconductor elements 5, with these components arranged such that they are stacked in this order, beginning from the top, and with the power module 23 as the bottom portion of the inverter unit. The inverter according to the present embodiment includes a discharging resistor 25. When the inverter is turned off, the charge stored in the smoothing capacitor 21 is discharged via the discharging resistor 25. A signal connector 26 is arranged on the external wall of the inverter chamber 13, which allows signals to be transmitted/received between the inverter and the vehicle side. The signal connector 26 is connected to one terminal of a flat cable 27 on the inner side of the wall of the inverter chamber 13. The other terminal of the flat cable 27 is connected to the motor control board 20.

The DC electric power received from an external battery 4 is input via a high-electric-power connector 28 arranged at one terminal of the inverter unit 2. The DC electric power is transmitted to a DC terminal 55 of the power module 23, and is converted by the power module 23 into AC electric power. The AC electric power thus converted is transmitted to the coil 14 via a lead wire 17 from an AC terminal 56 of the power module 23. In this state, the AC current is transmitted to the coil 14 via a current sensor 24. The AC current that passes through this path is detected by the current sensor 24. The current value of the AC current thus detected is transmitted to the motor control board 20, and is used to control the motor. The connection line that connects the lead wire 17 and the power module 23 is designed to be as short as possible in order to suppress the effects of surge and noise.

Figure 6:
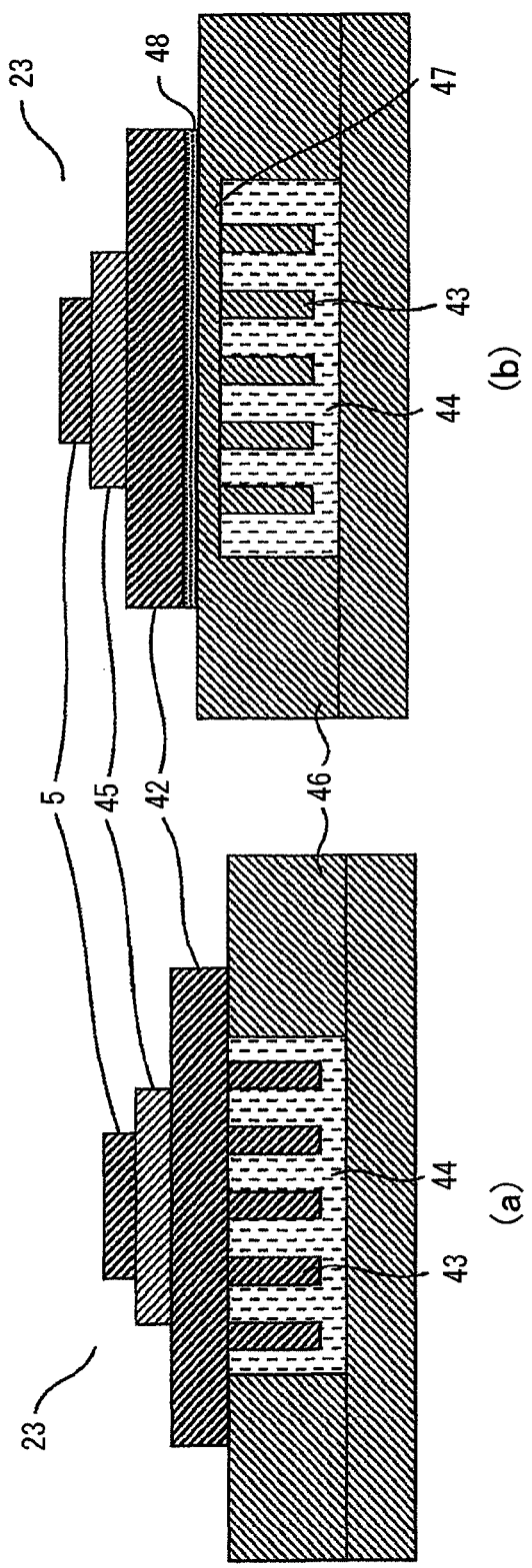
FIG. 6 is a diagram for describing a comparison between a direct water cooling method and an indirect water cooling method.
Figure 10:
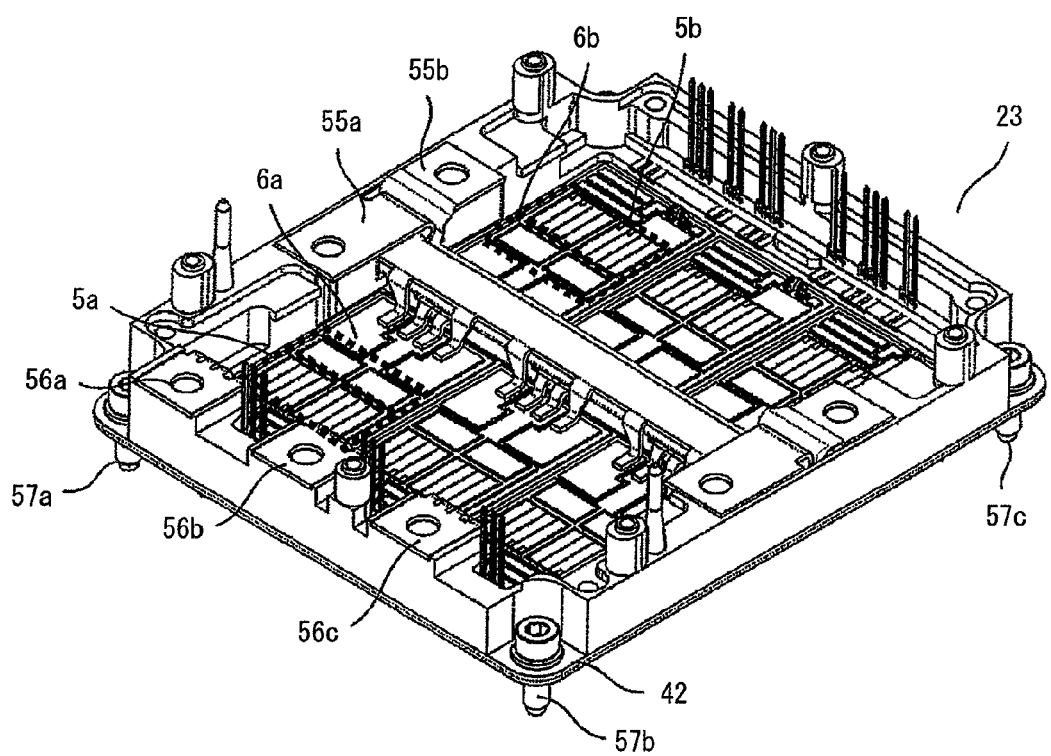
FIG. 10 is an external view (1) of a power module (internal layout).
Figure 11:
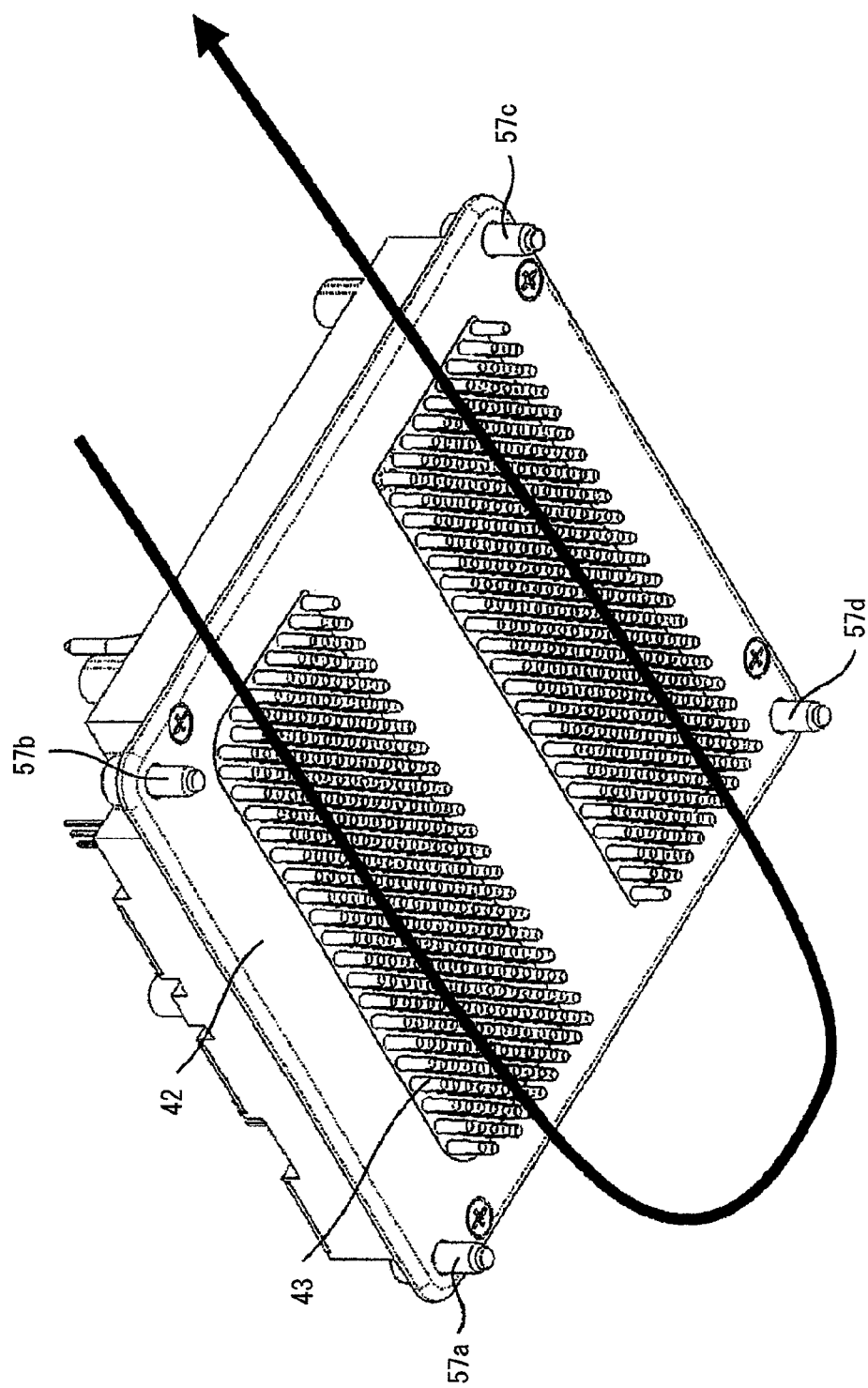
FIG. 11 is an external view (2) of the power module (relation between fins and water flow).

FIG. 6 is a schematic diagram showing a longitudinal configuration of the power module 23. FIGS. 10 and 11 are detailed external diagrams showing the power module 23. The power module 23 includes, in its lower portion, a heatsink plate 42 configured to release heat generated in the switching operation of the power semiconductor elements 5 arranged as internal components thereof. Fins 43 configured to radiate or release heat are arranged on the bottom face of the heatsink plate 42. Description is being made in the present embodiment regarding an arrangement in which the fins 43 are arranged as multiple cylindrical pin-shaped fins. However, the fins 43 may be formed in other shapes. The power module 23 is fixed by engaging each bolt 57 with a corresponding bolt hole 36 such that the power module 23 functions as a cover for an opening 35 formed in the bottom face of the inverter chamber 13. In this state, the fins 43 are arranged such that they protrude downward via the opening 35.

Figure 7:
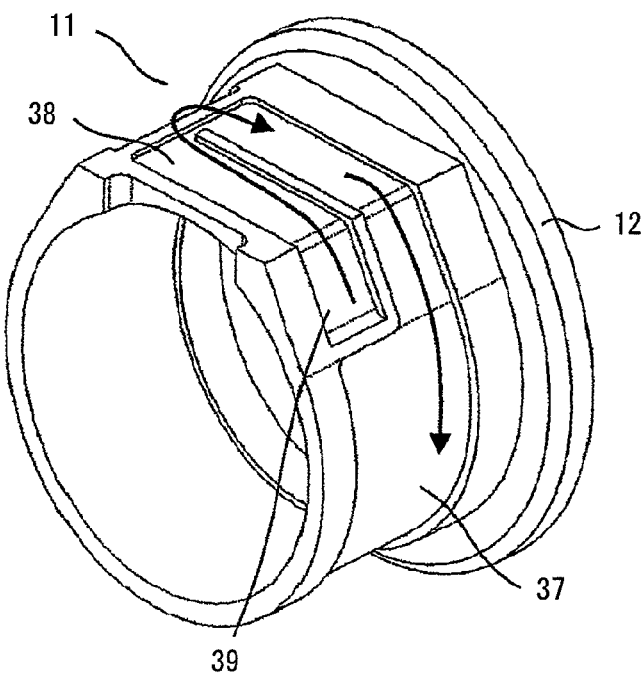
FIG. 7 is a diagram (1) for describing a flow path structure (U-turn structure).

FIG. 7 shows only the inner housing 11. A cooling flow path 37 having a long recessed belt-like structure is formed along the circumference of the outer face of the inner housing 11. The cooling flow path 37 is arranged around the surface of the inner housing in an approximately belt-like structure. By mounting the inner housing 11 within the outer housing 10, the outer housing 10 functions as a cover for the cooling flow path 37. In this state, a flow path inlet 39 is arranged downstream of an inlet pipe 15. Furthermore, O-rings or otherwise liquid sealing members are arranged on both sides of the cooling flow path 37 such that they extend in parallel with each other around the inner housing, which are not shown in the drawing, thereby providing a measure for preventing water leakage.

The fins 43 of the power module 23 are arranged such that they protrude via the opening 35 toward the flat face 38 of the cooling flow path 37. That is to say, the present embodiment employs a direct water cooling method in which heat generated by the power semiconductor elements 5 reaches the fins 43 monolithically integrated with the heatsink plate 42 via the heatsink plate 42, and the power semiconductor elements 5 are cooled by directly cooling the fins 43. It should be noted that description is being made assuming that water cooling using cooling water is employed. However, the cooling medium is not restricted to water.

FIG. 6 is a schematic diagram showing a longitudinal internal structure of the power module 23 in order to make a comparison between a direct water cooling method and an indirect water cooling method. FIG. 6(*a*) shows an arrangement employing a direct water cooling method, and FIG. 6(*b*) shows an arrangement employing an indirect water cooling method. Typically, the power module 23 has a longitudinal internal structure including the power semiconductor elements 5, an insulating substrate 45, and the heatsink plate 42 arranged in this order, beginning from the top.

With such an indirect water cooling arrangement, the fins 43 are arranged on the water flow path side of the casing inner wall 47 of the inverter casing 46. The power module 23 is arranged on the opposite face of the casing inner wall 47 with respect to the fins 43. At this stage, typically, thermal grease 48 is applied between the heatsink plate 42 of the power module and the inner wall 47 of the inverter casing, thereby contributing to improving the thermal conductivity of the interface at which a metal member is in contact with another metal member. That is to say, heat generated by the power semiconductor elements 5 is radiated or released to cooling water 44 from the heatsink plate 42 via the thermal grease 48 and the inverter casing inner wall 47.

With such a direct water cooling arrangement, the power module 23 is fixed at the inverter casing 46 in the same way as the aforementioned indirect water cooling arrangement. The point of difference between these arrangements is that, with such a direct water cooling arrangement, an opening is formed in the face on which the power module 23 is to be mounted, and the power module 23 is mounted so as to cover the opening. That is to say, with such an arrangement in which the fins 43 are arranged on the heatsink plate 42, the fins 43 are arranged such that they protrude on the cooling water side. Thus, the cooling water 44 is directly in contact with the heatsink plate 42 and the fins 43, thereby releasing heat generated by the power semiconductor elements 5.

With such an arrangement employing an indirect water cooling method, the thermal resistance through the path from the power semiconductor elements (IGBTs) 5 to the cooling water 44 is on the order of 0.15° C./W. With such an arrangement employing a direct water cooling method, the thermal resistance is on the order of 0.09° C./W. That is to say, an arrangement employing an indirect water cooling method provides a thermal resistance 1.5 times higher than with a direct water cooling method. In other words, from the perspective of the required heatsink area, such an arrangement employing a direct water cooling method requires the power module 23 to have only a small bottom area, which is 1/1.5 smaller than that in a case in which an indirect water cooling method is employed.

For such an inverter-integrated motor having a configuration in which an inverter is mounted on a housing of the motor, it is important to allow the inverter to have a small bottom area, as compared with an arrangement in which an inverter and a motor are mounted as separate respective units. Thus, such a direct water cooling method can be effectively applied to the present embodiment. At the same time, such an arrangement provides increased torque per volume as compared with an arrangement employing an indirect water cooling method.

Furthermore, as shown in FIG. 10, the power module 23 employed in the present embodiment has a layout in which six power semiconductor elements 5 are arranged such that three of the power semiconductor elements 5 respectively face the other three power semiconductor elements 5 (i.e., the power semiconductor elements 5 are arranged in two rows in parallel), thereby allowing the water flow path to have a reduced length in the longitudinal direction. That is to say, such an arrangement provides a power module structure suitable for mounting an a cylindrical motor housing.

Furthermore, the present invention has the following function for cooling the power module 23. Typically, the cooling flow path 37 shown in FIG. 7 is designed assuming that fluid flows in one direction from the inlet to the outlet. However, with the present embodiment as shown in FIG. 7, the cooling how path 37 is formed such that fluid makes a U-turn at a flat portion 38 that corresponds to the lower portion of the power module. In this region, the water flow path has a narrow width. Thus, such an arrangement provides an increased flow rate (or flow velocity) at the lower portion of the power module, thereby effectively cooling the six power semiconductor elements 5 arranged as internal components while requiring only a small cooling space.

With the present embodiment, the cooling flow path 37 is formed of two cooling flow paths (i.e., a first cooling flow path and a second cooling flow path). The first cooling flow path is provided to the casing portion between the stator and the electric power conversion apparatus, thereby cooling the electric power conversion apparatus by means of a cooling medium that flows through the flow path. In this stage, the flow direction of the cooling medium changes after it has cooled the power semiconductor elements arranged in the first row, following which it cools the other power semiconductor elements arranged in the second row. Meanwhile, the second cooling flow path is provided to the casing portion outside of the stator. By means of the cooling medium flowing via the flow path around the rotating electric machine along the motor rotation direction, such an arrangement is capable of cooling the stator.

As described above, in FIG. 7, the first cooling flow path has a structure configured such that the cooling medium makes a U-turn at the flat portion 38. FIG. 7 shows such a cooling flow path structure configured such that the cooling medium makes a U-turn for exemplary purposes only. Also, the first cooling flow path may be configured in other structures as long as the flow direction of the cooling medium changes at the flat portion 38 so as to raise the flow rate (or flow velocity) of the cooling medium.

The second cooling flow path is formed such that it communicates with the first cooling flow path such that the cooling medium cools the stator after it has cooled the inverter. Furthermore, the second cooling flow path employs a structure configured such that, at the communicating portion, the second cooling flow path has a greater cross-sectional area than that of the first cooling flow path.

With the present embodiment, the cooling water has a function as motor cooling water for cooling the motor stator core and the coil 14, in addition to a function for cooling the inverter unit 2.

The important point to be noted here is the difference between the allowable temperature of the coil 14 of the motor and the operating temperature of the power module 23. Typically, the coil 14 of the motor is likely to have a high temperature. Accordingly, the temperature of the cooling water rises when it flows around the outer housing 10 and the inner housing 11. In ordinary cases, the maximum temperature of the coil 14 is estimated to reach up to a temperature in the vicinity of 180° C. However, the upper limit of the operating temperature of the power module 23 is on the order of 125° C. to 150° C., which includes an increase in the temperature due to the heat generated by the power module 23 itself. That is to say, such an inverter-integrated motor requires a design for suppressing to a minimum the effects of the temperature of the coil 14 on the power module 23.

Figure 8:
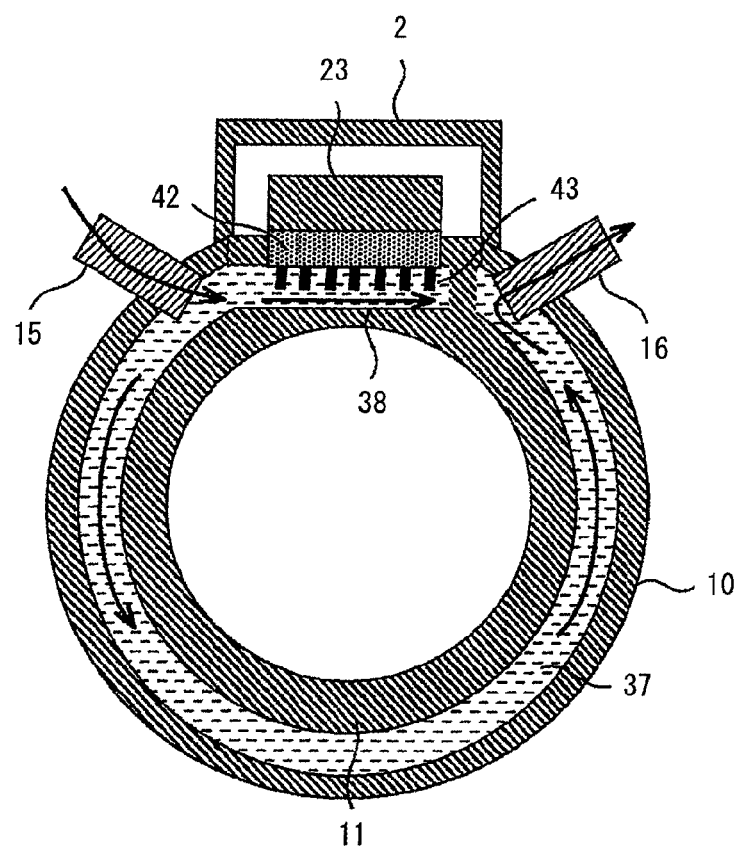
FIG. 8 is a diagram (2) for describing the flow path structure (relation 1 between the inlet and the outlet for cooling water).

FIG. 8 is a simplified cross-sectional diagram showing the present embodiment. The arrow indicates the cooling water flow. In the drawing, the cooling water input via the inlet pipe 15 makes a U-turn after it passes below the heatsink plate 42 of the power module 23 and through between the fins 43, as shown in FIG. 7. Thus, at this position (right side of the flat face 38 of the flow path) in FIG. 8, the cooling water flows toward the back of the drawing. Subsequently, the cooling water flows around the circumference of the motor coil counterclockwise in the figure, and flows toward the output pipe 16. As described above, the present embodiment is designed such that the distance between the inlet pipe 15 for the cooling water and the power module 23 is reduced as much as possible, thereby cooling the power module 23 in the first stage using the cooling water at its lowest temperature. By employing such a design, such an arrangement is capable of suppressing to a minimum the thermal effects of the high temperature of the coil 14 on the power module 23.

Figure 9:
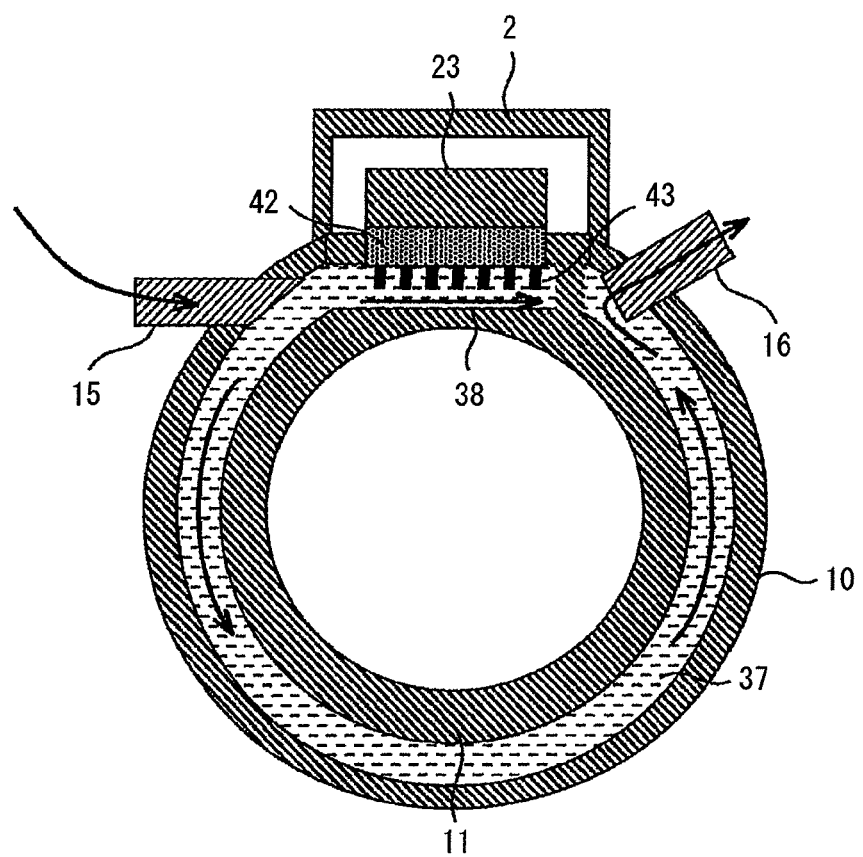
FIG. 9 is a diagram (3) for describing the flow path structure (relation 2 between the inlet and the outlet for cooling water).

Also, FIG. 9 shows a modification obtained by modifying the structure of the inlet pipe 15 shown in FIG. 8. Such a modification has a structure in which the inlet pipe 15 is arranged in parallel with the flat portion 38. Thus, such a modification provides increased momentum in the flow of the cooling water input via the inlet pipe 15, thereby providing an increased flow rate as compared with an arrangement shown in FIG. 8. As a result, such a modification provides a structure with improved effectiveness of cooling the power semiconductor elements 5 without involving a large cooling space.

It should be noted that description has been made with reference to an example in which the inverter unit 2 and the motor unit 3 are completely monolithically integrated as a single unit. Also, such an inverter unit 2 and a motor unit 3 may be formed as separate respective units, and these separate units may be monolithically integrated in a subsequent stage, thereby providing an inverter-integrated motor. Examples of the advantages of such an arrangement include an advantage in that, in a case in which either one of the inverter unit 2 or the motor unit 3 is damaged, such an arrangement requires that only the damaged unit be repaired, and so forth. However, it should be noted that such an arrangement requires as sealing member such as an O-ring or the like to be applied to the interface between the two units.

The temperature of the cooling water 44 corresponds to the temperature of the motor cooling water, and at the same time corresponds to the temperature of the inverter cooling water. That is to say, a temperature sensor may be arranged in the vicinity of the fins 43 immersed in the cooling water 44, which is not shown in the drawing showing the present embodiment, and the information obtained by the temperature sensor may be supplied to the motor control board 20, thereby allowing the water temperature for cooling the motor and the water temperature for cooling the inverter to be controlled at the same time. Such an arrangement can be effectively applied to an arrangement in which each component is required to be maintained in its own temperature range, or an arrangement in which cooling should be controlled for each component. For example, such an arrangement enables a control operation in which the current is controlled (i.e., a limit is placed on the torque) according to the water temperature in a case in which there is a high probability of increased water temperature having adverse effects on the power module or otherwise on the stator side of the motor.

Description has been made above regarding various kinds of embodiments and modifications. However, the present invention is not restricted to the contents of such embodiments and modifications. Also various other kinds of embodiments may be made without departing from the technical scope of the present invention, which are also encompassed in the present invention.

The entire contents disclosed in Japanese Patent Application No. 2010-041233 (filed on Feb. 26, 2010) are incorporated herein by reference.

The invention claimed is:

1. A rotating electric machine system, comprising:
a rotating electric machine including a stator;
a casing comprising a lower casing section configured to house the stator, the lower casing section having an outer housing portion and an inner housing portion disposed radially within the outer housing portion;
an electric power conversion apparatus housed by an upper casing section of the casing, and configured to drive the rotating electric machine; and
a first cooling flow path recessed in a flat portion of the inner housing portion, the flat portion substantially parallel with a bottom face of the electric power conversion apparatus and disposed between the stator and the electric power conversion apparatus, wherein a cooling medium is caused to flow through the first cooling flow path so as to cool the stator and the electric power conversion apparatus, wherein:
the electric power conversion apparatus comprises a power module configured to include a power semiconductor element therein;
the power module comprises one or more heat radiation fins which extend into the first cooling flow path through an opening formed in the bottom face of the electric power conversion apparatus;
the first cooling flow path communicates with an inlet pipe where the cooling medium is input; and
the inlet pipe is arranged substantially parallel with the flat portion.

2. A rotating electric machine system according to claim 1, further comprising:
a second cooling flow path arranged in a curved portion of the inner housing portion, the curved portion disposed around a radial outer periphery of the stator and extending along a direction of rotation of the rotating electric machine, wherein the cooling medium is caused to flow through the second cooling flow path, wherein:
the second cooling flow path communicates with the first cooling flow path such that the cooling medium cools the stator after cooling the electric power conversion apparatus.

3. A rotating electric machine system according to claim 2, wherein:
the first cooling flow path has a structure configured to change a direction in which the cooling medium flows; and
the second cooling flow path communicates with the first cooling flow path such that the cooling medium cools the stator after cooling the electric power conversion apparatus and the second cooling flow path has a greater cross-sectional area than a cross-sectional area of the first cooling flow path at a communicating portion.

4. A rotating electric machine system according to claim 1, wherein:
the power module is configured to include power semiconductor elements in two rows; and
the first cooling flow path is configured such that the cooling medium cools the power semiconductor elements arranged in a first row, following which a direction in which the cooling medium flows is changed, and the cooling medium cools the other power semiconductor elements arranged in a second row.

5. A rotating electric machine system, comprising:
a rotating electric machine including a stator;
an electric power conversion apparatus housed by an upper casing section of a casing and configured to drive the rotating electric machine;
a first cooling flow path recessed in a flat portion of an inner housing portion of a lower section of the casing, the flat portion substantially parallel with a bottom face of the electric power conversion apparatus and disposed between the stator and the electric power conversion apparatus, wherein a cooling medium is caused to flow through the first cooling flow path so as to cool the stator and the electric power conversion apparatus; and
a second cooling flow path arranged in a curved portion of the inner housing portion, the curved portion disposed around a radial outer periphery of the stator, and is configured such that the stator is cooled by the cooling medium that flows via the second cooling flow path along a direction of rotation of the rotating electric machine, wherein:
the first cooling flow path has a structure configured to change a direction in which the cooling medium flows;
the second cooling flow path communicates with the first cooling flow path such that the cooling medium cools the stator after cooling the electric power conversion apparatus, and the second cooling flow path has a greater cross-sectional area than a cross-sectional area of the first cooling flow path at a communicating portion;
the electric power conversion apparatus comprises a power module configured to include a power semiconductor element therein;
the power module comprises one or more heat radiation fins which extend into the first cooling flow path through an opening formed in the bottom face of the electric power conversion apparatus;
the first cooling flow path communicates with an inlet pipe where the cooling medium is input; and
the inlet pipe is arranged substantially parallel with the flat portion.

6. A rotating electric machine system according to claim 5, wherein:
the power module is configured to include power semiconductor elements in two rows; and
the first cooling flow path is configured such that the cooling medium cools the power semiconductor elements arranged in a first row, following which a direction in which the cooling medium flows is changed, and the cooling medium cools the other power semiconductor elements arranged in a second row.

\* \* \* \* \*